United States Patent
Ersoz

(10) Patent No.: US 12,385,998 B2
(45) Date of Patent: Aug. 12, 2025

(54) SYSTEM AND METHOD FOR REDUCED FINE-LINE ARTIFACTS IN MAGNETIC RESONANCE IMAGING

(71) Applicant: GE Precision Healthcare LLC, Waukesha, WI (US)

(72) Inventor: Ali Ersoz, Wauwatosa, WI (US)

(73) Assignee: GE Precision Healthcare LLC, Waukesha, WI (US)

( * ) Notice: Subject to any disclaimer, the term of this patent is extended or adjusted under 35 U.S.C. 154(b) by 190 days.

(21) Appl. No.: 18/499,149

(22) Filed: Oct. 31, 2023

(65) Prior Publication Data

US 2025/0138119 A1    May 1, 2025

(51) Int. Cl.
*G01R 33/48*    (2006.01)
*G01R 33/565*   (2006.01)

(52) U.S. Cl.
CPC ....... *G01R 33/4818* (2013.01); *G01R 33/565* (2013.01)

(58) Field of Classification Search
CPC .............. G01R 33/4818; G01R 33/565; G01R 33/5617; G01R 33/4824
See application file for complete search history.

(56) References Cited

U.S. PATENT DOCUMENTS

| | | | | |
|---|---|---|---|---|
| 4,564,017 A | * | 1/1986 | Glover | G01R 33/5676 |
| | | | | 324/307 |
| 4,567,893 A | * | 2/1986 | Charles | A61B 5/0816 |
| | | | | 324/309 |
| 4,612,504 A | * | 9/1986 | Pelc | G01R 33/565 |
| | | | | 324/309 |

OTHER PUBLICATIONS

Bernstein et al., "Imaging Artifacts at 3.0T", JMRI 24:735-746 (2006) https://onlinelibrary.wiley.com/doi/epdf/10.1002/jmri.20698, 12 pages.
Yutzy et al., "Improvements in Multislice Parallel Imaging Using Radial Caipirinha", MRM 65:1630-1637 (2011). https://onlinelibrary.wiley.com/doi/epdf/10.1002/mrm.22752, 8 pages.

* cited by examiner

*Primary Examiner* — G.M. A Hyder

(57) ABSTRACT

A method for imaging a subject using an magnetic resonance imaging (MR) system is presented. The method includes sampling a k-space in a rotating fashion using a plurality of radially directed blades around a center of the k-space. A first subset of blades is acquired with a positive excitation pulse and a first plurality of refocusing pulses. Further, a second subset of blades is acquired with a negative excitation pulse and a second plurality of refocusing pulses. The polarity of the second subset of blades is inverted to generate a third subset of blades. The first subset of blades and the third subset of blades are then combined to generate a final k-space. Finally, a medical image of the subject is generated based on a reconstruction of the final k-space.

20 Claims, 7 Drawing Sheets

SYSTEM AND METHOD FOR REDUCED FINE-LINE ARTIFACTS IN MAGNETIC RESONANCE IMAGING

BACKGROUND

Embodiments disclosed in the present invention relate to magnetic resonance imaging (MRI) systems and methods, and more particularly, to techniques for reducing fine-line artifacts in MRI.

As a medical imaging modality, Magnetic resonance imaging (MRI), can obtain images of the human body without using X-rays or other ionizing radiation. MRI uses a magnet having a strong magnetic field to generate a static magnetic field B0. When a part of the human body to be imaged is positioned in the static magnetic field B0, nuclear spin associated with hydrogen nuclei in human tissue is polarized, so that the tissue of the to-be-imaged part generates a longitudinal magnetization vector at a macroscopic level. After a radio-frequency field B1 intersecting the direction of the static magnetic field B0 is applied, the direction of rotation of protons changes so that the tissue of the to-be-imaged part generates a transverse magnetization vector at a macroscopic level. After the radio-frequency field B1 is removed, the transverse magnetization vector decays in a spiral manner until it is restored to zero. A free induction decay signal is generated during decay. The free induction decay signal can be acquired as a magnetic resonance signal, and a tissue image of the to-be-imaged part can be reconstructed based on the acquired signal.

In MRI, fine-line artifacts refer to an unwanted visual distortion or signal interference that appears as thin, dark or bright lines on the image. These artifacts are typically caused by interference of the desired signal with an unwanted signal that is a result of system imperfections.

In some cases, the fine-line artifacts can be reduced by either increasing gradient crusher areas or using a double number of excitations (NEX2) for the same region of interest. However, the drawback of increased gradient crusher area is that it also increases echo spacing time which causes blurring in the image. On the other hand, fine-line artifacts reduction with NEX2 technique doubles the scan time.

Therefore, there is a need for an improved approach that overcomes the limitations of existing MRI techniques.

BRIEF DESCRIPTION

In accordance with an embodiment of the present technique, a method for imaging a subject using an magnetic resonance imaging (MRI) system is presented. The method includes sampling a k-space in a rotating fashion using a plurality of radially directed blades around a center of the k-space, wherein a first subset of blades is acquired with a positive excitation pulse and a first plurality of refocusing pulses, and wherein a second subset of blades is acquired with a negative excitation pulse and a second plurality of refocusing pulses. The method also includes inverting the polarity of the second subset of blades to generate a third subset of blades. Further, the first subset of blades and the third subset of blades are combined to generate a final k-space. Finally, the method includes generating a medical image of the subject based on a reconstruction of the final k-space.

In accordance with another embodiment of the present technique a magnetic resonance imaging (MRI) system is presented. The MRI system includes a magnet configured to generate a main magnetic field about at least a portion of a subject arranged in the MRI system and a gradient coil assembly configured to apply at least one gradient field to the main magnetic field, The MRI system further includes a radio frequency (RF) system configured to apply an RF field to the subject and to receive magnetic resonance signals from the subject and a processing system. The processing system is programmed to sample a k-space in a rotating fashion using a plurality of radially directed blades around a center of the k-space. A first subset of blades is acquired with a positive excitation pulse and a first plurality of refocusing pulses. Further, a second subset of blades is acquired with a negative excitation pulse and a second plurality of refocusing pulses, The processing system is further configured to invert the polarity of the second subset of blades to generate a third subset of blades and combine the first subset of blades and the third subset of blades to generate a final k-space. The processing system is also configured to generate a medical image of the subject based on a reconstruction of the final k-space.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
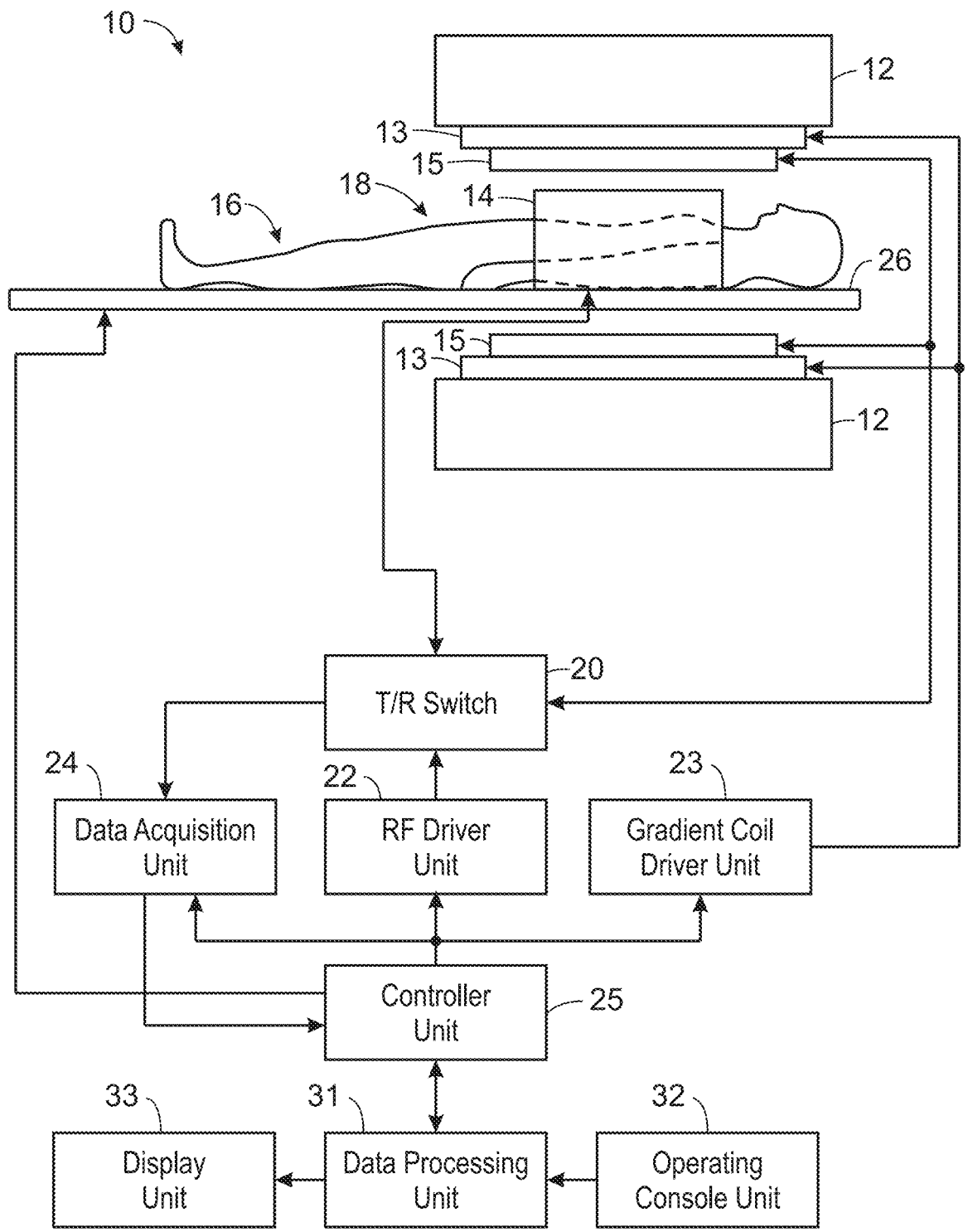
FIG. 1 is a schematic diagram of an exemplary magnetic resonance imaging (MRI) system, in accordance with an embodiment of the present technique.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present embodiments, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments. Furthermore, the terms "circuit" and "circuitry" and "controller" may include either a single component or a plurality of components, which are either active and/or passive and are connected or otherwise coupled together to provide the described function.

In magnetic resonance imaging (MRI), an object or a subject is placed in a magnet. When the object is in the magnetic field generated by the magnet, magnetic moments of nuclei, such as protons, attempt to align with the magnetic field but process about the magnetic field in a random order at the nuclei's Larmor frequency. The magnetic field of the magnet is referred to as B0 and extends in the longitudinal or z direction. In acquiring a MR image, a magnetic field (referred to as an excitation field B1), which is in the x-y plane and near the Larmor frequency, is generated by a radio-frequency (RF) coil and may be used to rotate, or "tip," the net magnetic moment $M_z$ of the nuclei from the z direction to the transverse or x-y plane. A signal, which is referred to as a MR signal, is emitted by the nuclei, after the excitation signal B1 is terminated. To use the MR signals to generate an image of an object, magnetic field gradient pulses ($G_x$, $G_y$, and $G_z$) are used. The gradient pulses are used to scan through the k space, the space of spatial frequencies or inverse of distances. A Fourier relationship exists between the acquired MR signals and an image of the object, and therefore the image of the object can be derived by reconstructing the MR signals. The images of the object may include two dimensional (2D) or three-dimensional (3D) images.

In order to reduce motion artifacts in MR images, Periodically Rotated Overlapping Parallel Lines with Enhanced Reconstruction (PROPELLER) imaging is introduced. The PROPELLER is a Fast Spin Echo (FSE) based application which provides motion-robust imaging. In PROPELLER imaging, the k-space data may be sampled from a plurality of blades of k-space data acquired in a rotational manner around the center of the k-space. However, one challenge in all FSE applications is the artifacts or the unwanted signal arising due to insufficiently crushed free induction decay (FID) signal from refocusing radio frequency (RF) pulses. This type of artifacts, known as fine-line, appear as equally-spaced lines on the image.

Fine-line artifacts in PROPELLER can be reduced by either increasing crusher areas or acquiring same blade more than once (true NEX with reversing excitation RF pulse polarity). The drawback of increased crusher area is that it also increases echo spacing time which causes blurring in the image. On the other hand, fine-line reduction with true NEX increases the scan time at least by twice. In accordance with an embodiment of the present technique, the fine-line artifact reduction problem is addressed by applying RF chopping in every other blade, without increasing the crusher areas, which causes destructive interference in PROPELLER images, to reduce fine-line artifacts without increasing echo spacing or scan time penalty.

Embodiments of the present disclosure will now be described, by way of an example, with reference to the figures, in which FIG. 1 illustrates a magnetic resonance imaging (MRI) apparatus 10. The MRI apparatus 10 includes a magnetostatic field magnet unit 12, a gradient coil unit 13, an RF coil unit 14, an RF body or volume coil unit 15, a transmit/receive (T/R) switch 20, an RF driver unit 22, a gradient coil driver unit 23, a data acquisition unit 24, a controller unit 25, a patient table or bed 26, a data processing unit 31, an operating console unit 32, and a display unit 33. In some embodiments, the RF coil unit 14 is a surface coil, which is a local coil typically placed proximate to the anatomy of interest of a subject 16. Herein, the RF body coil unit 15 is a transmit coil that transmits RF signals, and the local surface RF coil unit 14 receives the MR signals. As such, the transmit body coil (e.g., RF body coil unit 15) and the surface receive coil (e.g., RF coil unit 14) are separate but electromagnetically coupled components and may be together or separately called as a radio frequency (RF) system. The MRI apparatus 10 transmits electromagnetic pulse signals to the subject 16 placed in an imaging space 18 with a static magnetic field formed to perform a scan for obtaining magnetic resonance signals from the subject 16. One or more images of the subject 16 can be reconstructed based on the magnetic resonance signals thus obtained by the scan.

The magnetostatic field magnet unit 12 includes, for example, an annular superconducting magnet, which is mounted within a toroidal vacuum vessel. The magnet defines a cylindrical space surrounding the subject 16 and generates a constant primary magnetostatic field B0.

The MRI apparatus 10 also includes a gradient coil unit 13 that forms a gradient magnetic field in the imaging space 18 so as to provide the magnetic resonance signals received by the RF coil arrays with three-dimensional positional information. The gradient coil unit 13 includes three gradient coil systems, each of which generates a gradient magnetic field along one of three spatial axes perpendicular to each other, and generates a gradient field in each of a frequency encoding direction, a phase encoding direction, and a slice selection direction in accordance with the imaging condition. More specifically, the gradient coil unit 13 applies a gradient field in the slice selection direction (or scan direction) of the subject 16, to select the slice; and the RF body coil unit 15 or the local RF coil arrays may transmit an RF pulse to a selected slice of the subject 16. The gradient coil unit 13 also applies a gradient field in the phase encoding direction of the subject 16 to phase encode the magnetic resonance signals from the slice excited by the RF pulse. The gradient coil unit 13 then applies a gradient field in the frequency encoding direction of the subject 16 to frequency encode the magnetic resonance signals from the slice excited by the RF pulse.

The RF coil unit 14 is disposed, for example, to enclose the region to be imaged of the subject 16. In some examples, the RF coil unit 14 may be referred to as the surface coil or the receive coil. In the static magnetic field space or imaging space 18 where a static magnetic field B0 is formed by the magnetostatic field magnet unit 12, the RF coil unit 15 transmits, based on a control signal from the controller unit 25, an RF pulse that is an electromagnet wave to the subject 16 and thereby generates a high-frequency magnetic field B1. This excites a spin of protons in the slice to be imaged of the subject 16. The RF coil unit 14 receives, as a magnetic resonance signal, the electromagnetic wave generated when the proton spin thus excited in the slice to be imaged of the subject 16 returns into alignment with the initial magnetization vector. In some embodiments, the RF coil unit 14 may transmit the RF pulse and receive the MR signal. In other embodiments, the RF coil unit 14 may only be used for receiving the MR signals, but not transmitting the RF pulse.

Figure 2:
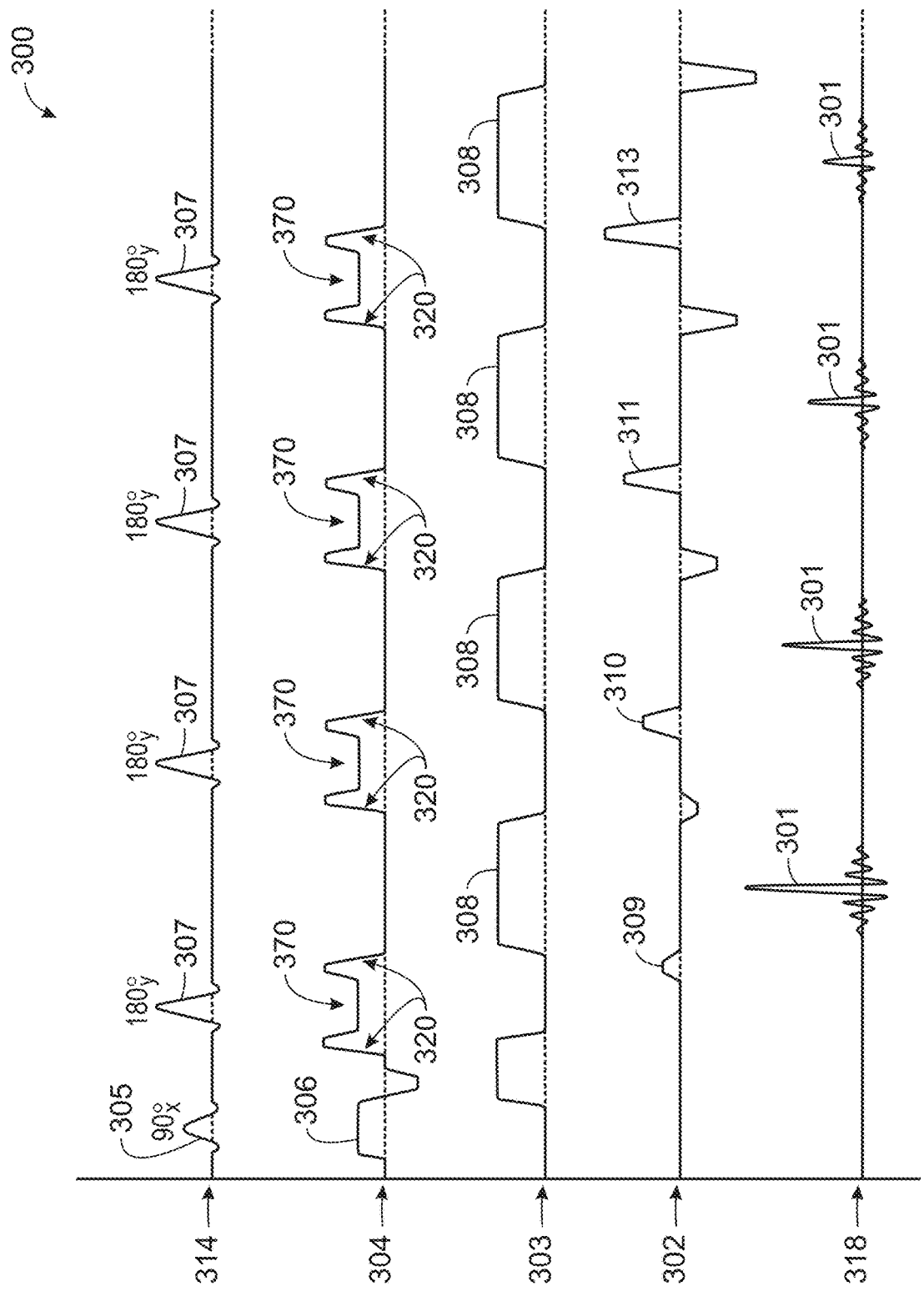
FIG. 2 is a schematic diagram of a fast spin echo (FSE) pulse sequence, in accordance with an embodiment of the present technique.

In one embodiment, the k-space data may be sampled with a fast spin echo (FSE) pulse sequence. For example, a 90 degree excitation RF pulse may be transmitted to rotate the proton magnetization 90 degrees, then a plurality of 180 degree refocusing RF pulses may be transmitted to reverse the direction of proton precession as shown in FIG. 2. After each 180 degree RF pulse, an echo (MR signal) may be received from the RF coil. Herein, the 90 degree RF pulses are excitations, and the duration between consecutive 90 degree RF pulses is the repetition time (TR). Data along each phase encoding line may be acquired by sampling one echo, and multiple phase encoding lines may be acquired within the TR. In another example, the k-space data may be sampled using echo-planar pulse sequence or gradient echo pulse sequence.

FIG. 2 is a schematic diagram of a FSE pulse sequence 300. The pulse sequences diagram 300 may be generated by different modules of MRI system control 32 of FIG. 1. Plot 302 and plot 303 show phase encode and readout gradient waveforms i.e., $G_y$ and $G_x$, respectively. Plot 304 shows a slice selection gradient waveform $G_z$. Each of the gradient waveforms 302, 303 and 304 excites a corresponding physical gradient coil in a gradient coil assembly 50. Further, plot 314 shows RF signal waveform which excites RF coil 56 and generates a corresponding echo signal (or MR signal) shown in plot 318. The RF signal waveform 314 includes a 90 degree excitation RF pulse 305 followed by a plurality of 180 degree refocusing RF pulses 307. It should be noted excitation RF pulse with angles different than 90 degrees may also be used. Further, refocusing RF pulses with angles different than 180 degrees may also be used in other embodiments.

The 90° RF excitation pulse 305 is generated in the presence of a $G_z$ slice select gradient pulse 306 to provide transverse magnetization in a slice through the patient. This transverse magnetization is refocused by each of the plurality of 180° refocusing RF pulses 307 to produce the MR or echo signals 301 that are acquired in the presence of $G_x$ readout gradient pulses 308. Each MR signal 301 is separately phase encoded by respective $G_y$ phase encoding pulses 309-313.

Referring back to FIG. 1, the RF body coil unit 15 is disposed, for example, to enclose the imaging space 18, and produces RF magnetic field pulses orthogonal to the main magnetic field B0 produced by the magnetostatic field magnet unit 12 within the imaging space 18 to excite the nuclei. In contrast to the RF coil unit 14, which may be disconnected from the MRI apparatus 10 and replaced with another RF coil unit, the RF body coil unit 15 is fixedly attached and connected to the MRI apparatus 10. Furthermore, whereas local coils such as the RF coil unit 14 can transmit to or receive signals from only a localized region of the subject 16, the RF body coil unit 15 generally has a larger coverage area. The RF body coil unit 15 may be used to transmit or receive signals to the whole body of the subject 16, for example. Using receive-only local coils and transmit body coils provides a uniform RF excitation and good image uniformity at the expense of high RF power deposited in the subject. For a transmit-receive local coil, the local coil provides the RF excitation to the region of interest and receives the MR signal, thereby decreasing the RF power deposited in the subject. It should be appreciated that the particular use of the RF coil unit 14 and/or the RF body coil unit 15 depends on the imaging application.

The T/R switch 20 can selectively electrically connect the RF body coil unit 15 to the data acquisition unit 24 when operating in receive mode, and to the RF driver unit 22 when operating in transmit mode. Similarly, the T/R switch 20 can selectively electrically connect the RF coil unit 14 to the data acquisition unit 24 when the RF coil unit 14 operates in receive mode, and to the RF driver unit 22 when operating in transmit mode. When the RF coil unit 14 and the RF body coil unit 15 are both used in a single scan, for example if the RF coil unit 14 is configured to receive MR signals and the RF body coil unit 15 is configured to transmit RF signals, then the T/R switch 20 may direct control signals from the RF driver unit 22 to the RF body coil unit 15 while directing received MR signals from the RF coil unit 14 to the data acquisition unit 24. The coils of the RF body coil unit 15 may be configured to operate in a transmit-only mode or a transmit-receive mode. The coils of the local RF coil unit 14 may be configured to operate in a transmit-receive mode or a receive-only mode.

The RF driver unit 22 includes a gate modulator (not shown), an RF power amplifier (not shown), and an RF oscillator (not shown) that are used to drive the RF coils (e.g., RF coil unit 15) and form a high-frequency magnetic field in the imaging space 18. The RF driver unit 22 modulates, based on a control signal from the controller unit 25 and using the gate modulator, the RF signal received from the RF oscillator into a signal of predetermined timing having a predetermined envelope. The RF signal modulated by the gate modulator is amplified by the RF power amplifier and then output to the RF coil unit 15.

The gradient coil driver unit 23 drives the gradient coil unit 13 based on a control signal from the controller unit 25 and thereby generates a gradient magnetic field in the imaging space 18. The gradient coil driver unit 23 includes three systems of driver circuits (not shown) corresponding to the three gradient coil systems included in the gradient coil unit 13.

The data acquisition unit 24 includes a pre-amplifier (not shown), a phase detector (not shown), and an analog/digital converter (not shown) used to acquire the magnetic resonance signals received by the RF coil unit 14. In the data acquisition unit 24, the phase detector phase detects, using the output from the RF oscillator of the RF driver unit 22 as a reference signal, the magnetic resonance signals received from the RF coil unit 14 and amplified by the pre-amplifier, and outputs the phase-detected analog magnetic resonance signals to the analog/digital converter for conversion into digital signals. The digital signals thus obtained are output to the data processing unit 31.

The MRI apparatus 10 includes a table 26 for placing the subject 16 thereon. The subject 16 may be moved inside and outside the imaging space 18 by moving the table 26 based on control signals from the controller unit 25.

The controller unit 25 includes a computer and a recording medium on which a program to be executed by the computer is recorded. The program when executed by the computer causes various parts of the apparatus to carry out operations corresponding to pre-determined scanning. The recording medium may comprise, for example, a ROM, flexible disk, hard disk, optical disk, magneto-optical disk, CD-ROM, or non-volatile memory card. The controller unit 25 is connected to the operating console unit 32 and processes the operation signals input to the operating console unit 32 and furthermore controls the table 26, RF driver unit 22, gradient coil driver unit 23, and data acquisition unit 24 by outputting control signals to them. The controller unit 25 also controls, to obtain a desired image, the data processing unit 31 and the display unit 33 based on operation signals received from the operating console unit 32.

The operating console unit 32 includes user input devices such as a touchscreen, keyboard and a mouse. The operating console unit 32 is used by an operator, for example, to input such data as an imaging protocol and to set a region where an imaging sequence is to be executed. The data about the imaging protocol and the imaging sequence execution region are output to the controller unit 25.

The data processing unit 31 includes a computer and a recording medium on which a program to be executed by the computer to perform predetermined data processing is recorded. The data processing unit 31 is connected to the controller unit 25 and performs data processing based on control signals received from the controller unit 25. The data processing unit 31 is also connected to the data acquisition unit 24 and generates spectrum data by applying various image processing operations to the magnetic resonance signals output from the data acquisition unit 24.

The display unit 33 includes a display device and displays an image on the display screen of the display device based on control signals received from the controller unit 25. The display unit 33 displays, for example, an image regarding an input item about which the operator inputs operation data from the operating console unit 32. The display unit 33 also displays a two-dimensional (2D) slice image or three-dimensional (3D) image of the subject 16 generated by the data processing unit 31.

Figure 3A:
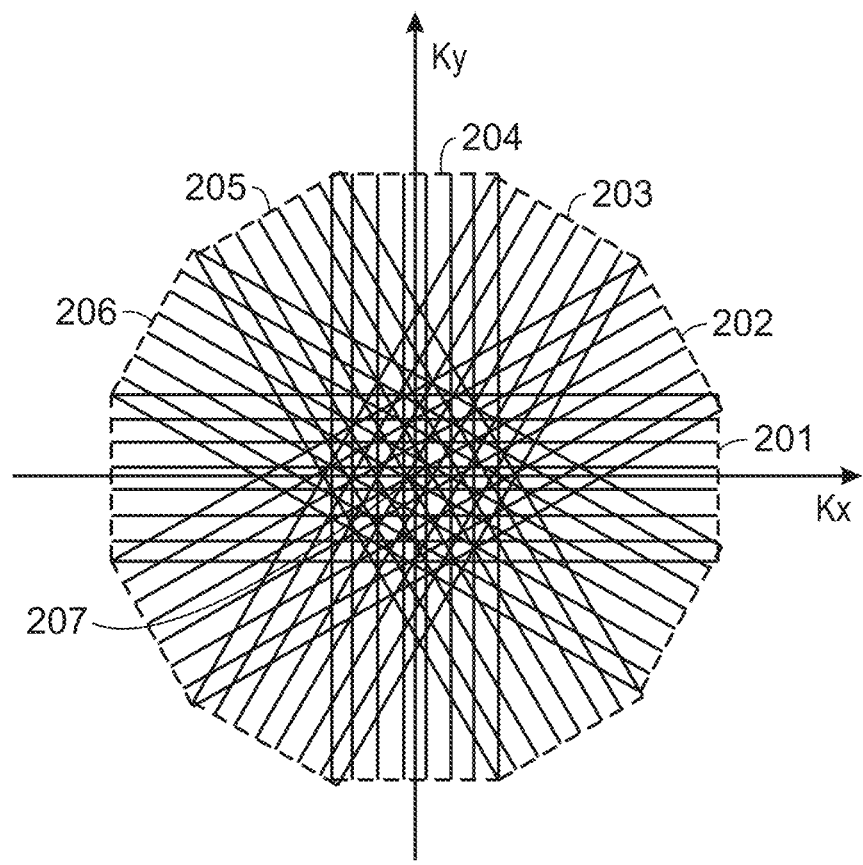
FIG. 3A illustrates plurality blades of k-space data acquired according to Periodically Rotated Overlapping Parallel Lines with Enhanced Reconstruction (PROPELLER) sampling scheme.
Figure 3B:
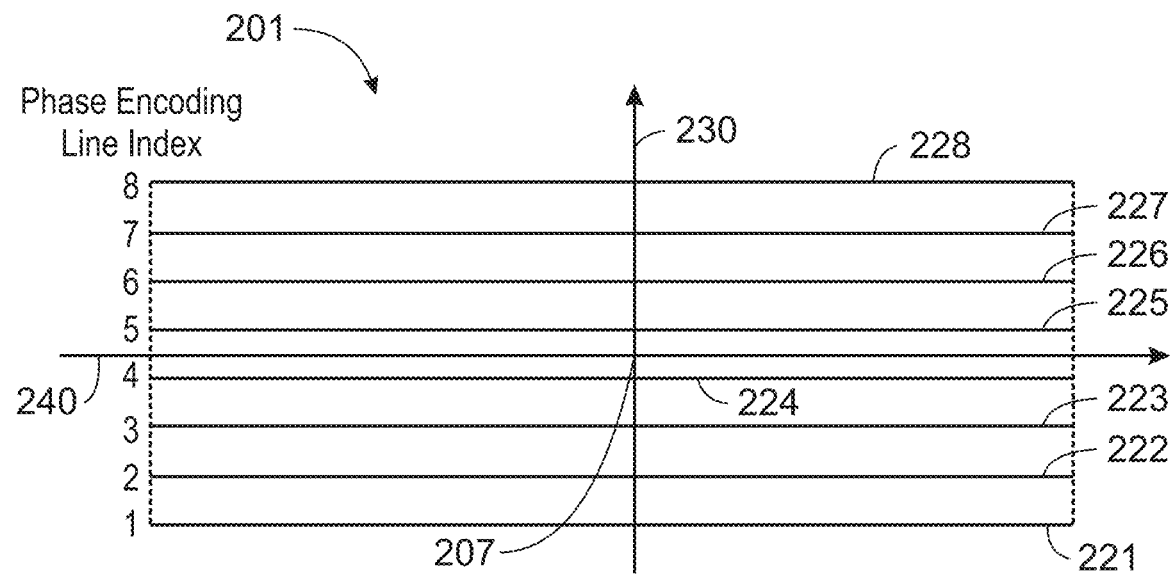
FIG. 3B illustrates phase encoding lines in one of the blades shown in FIG. 3A.

FIGS. 3A-3B show an example sampling scheme for acquiring k-space data using PROPELLER technique. The k-space is covered/sampled with a plurality of overlapping blades arranged in a rotational manner relative to a center 207 of the k-space. The rotation angle between adjacent blades is the same. Each blade covers a region of the k-space, and has a geometry center co-localized with the center of the k-space. In some embodiments, each blade covers a rectangular region of k-space, and the size (width and length) of the blades is the same. As one example, if the k-space is sampled with N blades, the adjacent blades are apart at an angle of 180/N degrees relative to the center of the k-space. In one embodiment, each blade may include a plurality of parallel phase encoding lines extending lengthwise across the blade.

In another embodiment, each blade may include only a single radial k-space line that passes through the center of k-space. Such an embodiment may represent a radial MR slice acquisition that uses a 2D radial sampling scheme. Further, in another embodiment, the technique may be extended to 3D sampling such as a stack-of-stars sampling which uses rectilinear (Cartesian) sampling in the z-direction while maintaining radial sampling in the xy-plane. In such an embodiment, the radial sampling in the xy-plane is achieved by acquiring the k-space blades as will be explained subsequently with respect to FIG. 3A but each blade consisting of only a single radial k-space line. In other words, in an embodiment, the plurality of blades (such as blades 201, 202, 203, 204, 205, 206), each having only a single radial line, are part of a 2D slice. A plurality of such slices or 2D slices are then arranged in perpendicular fashion (like a stack) to each other to generate a 3D volume.

As a non-limiting example, in FIG. 3A, six blades (201-206, shown in dashed line) are arranged in a rotational manner counter clockwise relative to the center 207 of the k-space to cover the 360 degrees of k-space. The adjacent blades are 30 degrees from each other. The phase encoding lines of each blade are drawn as solid lines.

Acquiring (or sampling) k-space data of the plurality of blades includes acquiring k-space data of each blade in a data acquisition direction. The data acquisition direction may be counter clockwise or clockwise relative to the k-space center. For example, k-space data of blades 201-206 may be acquired in a counter clockwise data acquisition direction. That is, the blades may be sampled in a sequence of blade 201, 202, . . . , 206. In one example, the blade with the blade phase encoding axis and the blade frequency encoding axis aligned with Ky and Kx axes may be sampled first. By sampling the k-space with overlapping blades, the low frequency components at the center of the k-space are oversampled, while the high frequency components at the periphery of the k-space are sampled at Nyquist rate. In this way, the motion artifacts may be removed.

FIG. 3B shows one blade 201 of the blades in FIG. 3A. As a non-limiting example, blade 201 includes eight phase encoding lines 221-228 arranged in parallel along the blade phase encoding axis 230 of blade 201. The arrow of the blade phase encoding axis 230 indicates the blade phase encoding direction. The blade frequency encoding axis 240 of blade 201 is perpendicular to the blade phase encoding axis 230, and intersects with the blade phase encoding axis 230 at the center of the blade. The arrow of the blade frequency encoding axis 240 indicates the blade frequency encoding direction. The center of blade 201 coincides with the center 207 of the k-space.

The blade phase encoding lines (221-228) are indexed (e.g. numbered) sequentially from 1 to 8, along the blade phase encoding direction shown as the arrow of the blade phase encoding axis 230. In other words, the indexes (numbers) of the phase encoding lines increases in the phase encoding direction. The phase encoding lines are sampled according to a phase encoding order. The phase encoding order may be different from the phase encoding line index.

Acquiring a blade of k-space data includes acquiring data along each of the phase encoding lines of the blade. In some embodiments, the k-space data of each blade is acquired with a single excitation pulse. After the excitation, a series of echo signals (or an echo train) are acquired as discussed with respect to FIG. 2, and data acquired from each echo signal fill one phase encoding line of the blade.

As discussed earlier, one challenge with conventional PROPELLER technique is the artifacts arising in the final image due to insufficiently crushed FID signal from refocusing RF pulses 307. This type of artifacts, known as fine-line, appear as equally-spaced lines on the final image. In one embodiment, fine-line artifacts in PROPELLER can be reduced by either increasing crusher areas 320 or acquiring same blade more than once with reversing the polarity of excitation RF pulse in between acquisitions (true NEX). The drawback of increased crusher area is that it also increases echo spacing time which causes blurring in the image. On the other hand, fine-line artifact reduction with RF chopping doubles the scan time.

In accordance with an embodiment of the present technique, the above stated problem is addressed by applying radio frequency (RF) chopping in every other blade, without increased crusher area, which causes destructive interference in PROPELLER images, to reduce fine-line artifacts without echo spacing or scan time penalty. In the RF chopping technique presented herein, the sign/polarity of the excitation pulse 305 is reversed in every other blade as will be explained subsequently.

Figure 4:
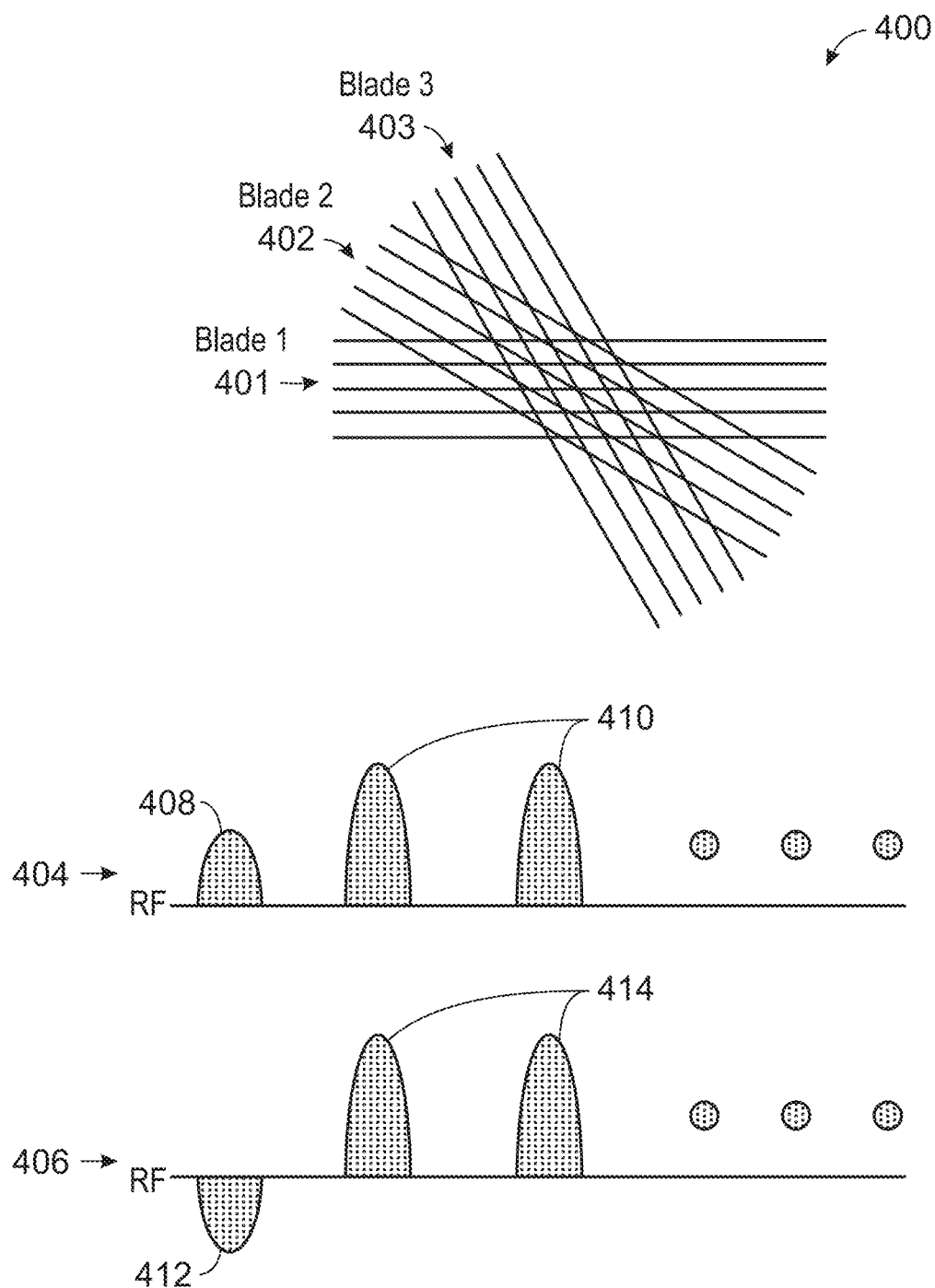
FIG. 4 shows a schematic diagram depicting the blade acquisition and corresponding radio frequency pulses, in accordance with an embodiment of the present technique.

FIG. 4 shows a schematic diagram 400 depicting the blade acquisition and corresponding radio frequency pulses in accordance with an embodiment of the present technique.

Specifically, FIG. 4 shows three blades: blade 1 (401), blade 2 (402) and blade 3 (403). It should be noted that only three blades are shown for ease of explanation, however, there are actually a plurality of blades that are acquired but not shown in FIG. 4. FIG. 4 also shows two RF pulse sequences 404 and 406. In the embodiment shown, the RF pulse sequence 404 correspond to odd blades acquisition i.e., blade 1, 3, 5 etc. and the RF pulse sequence 406 correspond to even blade acquisition i.e., blades 2, 4, 6 and so on. In another embodiment, blade sequence 404 may correspond to even blade acquisition and the RF pulse sequence 406 may then correspond to odd blade acquisition.

The RF pulse sequence 404 includes an excitation pulse 408 and refocusing pulses 410. Similarly, RF pulse sequence 406 includes an excitation pulse 412 and refocusing pulses 414. The main difference between RF pulse sequence 404 and the RF pulse sequence 406 is that their excitation pulses are of opposite sign (polarity) i.e., excitation pulse 408 and excitation pulse 412 have opposite signs. As can be seen excitation pulse 408 has positive sign whereas excitation pulse 412 has negative sign. However, in another embodiment, these signs can be interchanged i.e., excitation pulse 408 may be negative whereas excitation pulse 412 may be positive. In other words, in the present technique, the acquisition of alternate blades (e.g., odd and even blades) is performed with RF pulse sequences having excitation pulses that have alternate signs (e.g., positive and negative signs). It should also be noted that although the signs of excitation pulses may be alternated, the signs of refocusing pulses 410 and 414 for both RF pulses 404 and 406 remains same i.e., positive in this case.

Once all the blades of the k-space are acquired with the above alternate excitation pulse strategy (which is also referred to as a phase cycling technique), next thing is to reconstruct the image with the acquired k-space data. While reconstructing, the blade data that is acquired with the negative excitation pulse is multiplied with negative one (−1) to nullify the effect of opposite polarity. In this technique, every time there is change of polarity of the excitation pulse in acquisition of successive blades, there is a destructive interference which means that a signal is spread out all over the image and which is incoherent. In other words, from blade to blade the unwanted signal changes the polarity, which results in the unwanted signal being spread out all over the image. This results in reduction of appearance of fine-line artifact in the final image.

Figure 5:
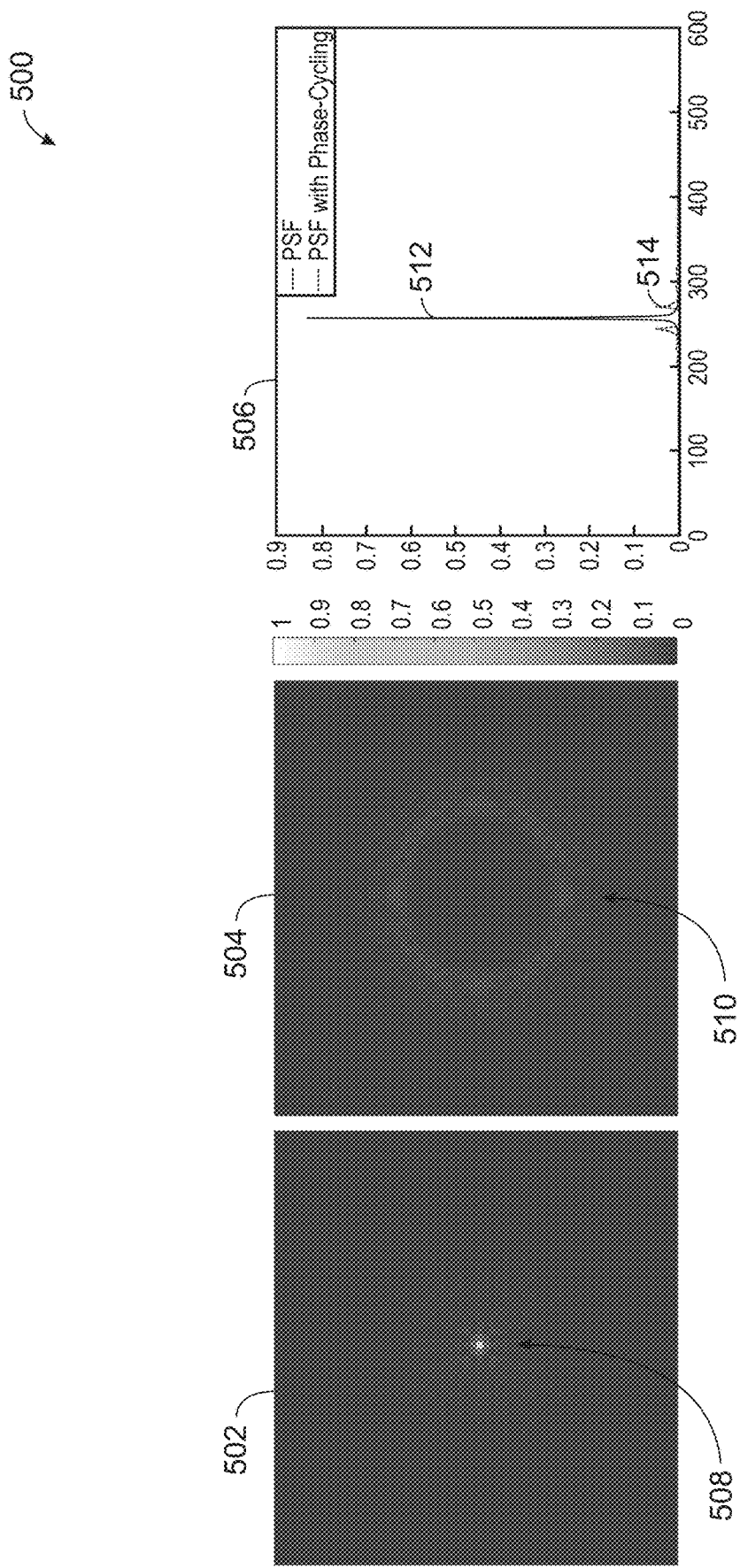
FIG. 5 is a schematic diagram depicting effect of a phase cycling technique on a point spread function (PSF), in accordance with an embodiment of the present technique.

FIG. 5 shows a schematic diagram 500 depicting effect of the phase cycling technique discussed above on a point spread function (PSF). Specifically, FIG. 5 shows a plot 502 of a point spread function, another plot 504 of the same point spread function with the phase cycling technique presented herein and a plot 506 of cross-sectional profiles of both PSFs i.e., with and without the phase cycling technique.

As will be appreciated by those skilled in the art, a PSF is a representation of how an object (i.e., a point source of signal) would spread out in the image due to the selected imaging technique (i.e., FSE or PROPELLER, . . . ) and various system factors like gradient field imperfections, receiver coil properties, and other system-related effects. In the PSF plot 502, the representation of the point source of signal appears as an extended blob 508. In other words, in the plot 502, the point source of signal appears as strongest at the center and gradually decreases away from the center.

If the point source of signal is an unwanted signal, then one would want to make the blob 508 disappear. As discussed earlier, the unwanted signal may arise due to insufficiently crushed free induction decay (FID) signal from refocusing radio frequency (RF) pulses. Therefore, the phase recycling technique described above helps in changing the appearance of the blob. With the phase recycling technique, every time there is change of polarity of the excitation pulse, there is a destructive interference which means that the point source of signal is spread out all over the image. As can be seen from plot 504, the blob 508 in plot 502 appears as an artifact 510 which is spread out all over the image in plot 504. Mainly, the central peak of blob 508 disappears in artifact 510 and the peak energy is distributed incoherently.

Plot 506 represents the same the cross-sectional profiles of both PSFs i.e., with and without the phase cycling technique. Specifically, a curve profile 512 represents PSF without the phase cycling technique corresponding to plot 502 and, a curve profile 514 represents PSF with the phase cycling technique corresponding to plot 504. As can be seen, the PSF profile 512 has a very high peak at the center whereas PSF profile 514 generated using the phase cycling technique has two significantly reduced (e.g., 15 to 20 times reduced) vicinal peaks around the center. Both profiles 512 and 514 then slowly disappear (i.e., reduce to zero) as the move away from the center. Thus, with the phase cycling technique, the unwanted signal which results in a fine line artifact is reduced in the final image.

Figure 6:
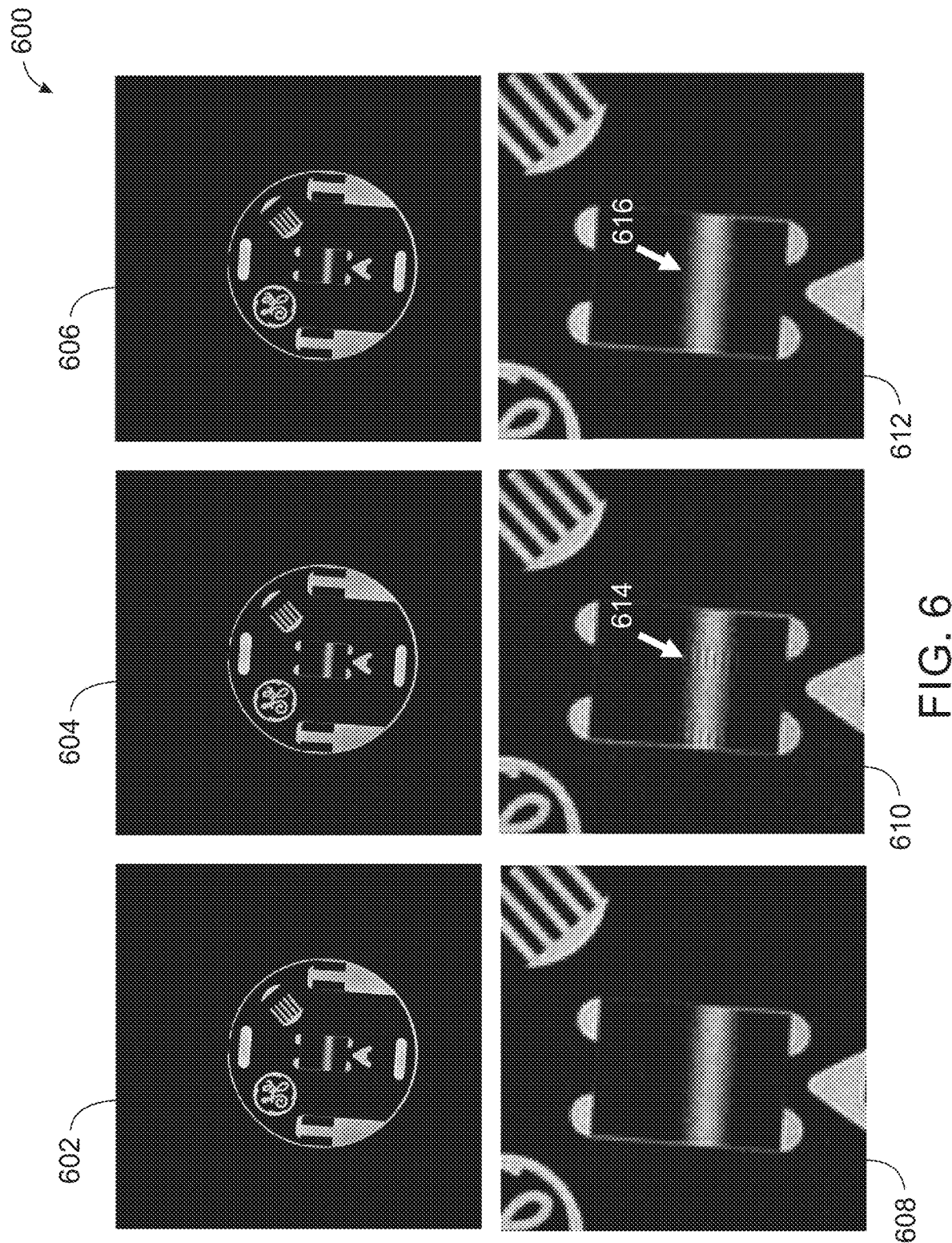
FIG. 6 is a schematic diagram depicting image quality comparison, in accordance with an embodiment of the present technique.

FIG. 6 shows a schematic diagram 600 depicting image quality comparison. Specifically, in FIG. 6, an image 602 corresponds to a ground truth image of a phantom. Further, image 604 is the reconstructed image of the phantom obtained without the phase cycling technique and image 606 is the reconstructed image of the phantom obtained with the phase cycling technique presented herein. Further, images 608, 610 and 612 zoomed view images of images 602, 604 and 606 respectively.

As can be seen from column 604, the fine-line artifacts 614 is quite prominent in the image 610 obtained without the use of the phase cycling technique. However, when the image is obtained using the phase cycling technique presented herein, the fine-line artifacts 616 are incoherently spread over the image 612. Thus, the image quality of image 612 is significantly improved in comparison to image 610 and the image 612 appears very similar to the ground truth image 608.

Figure 7:
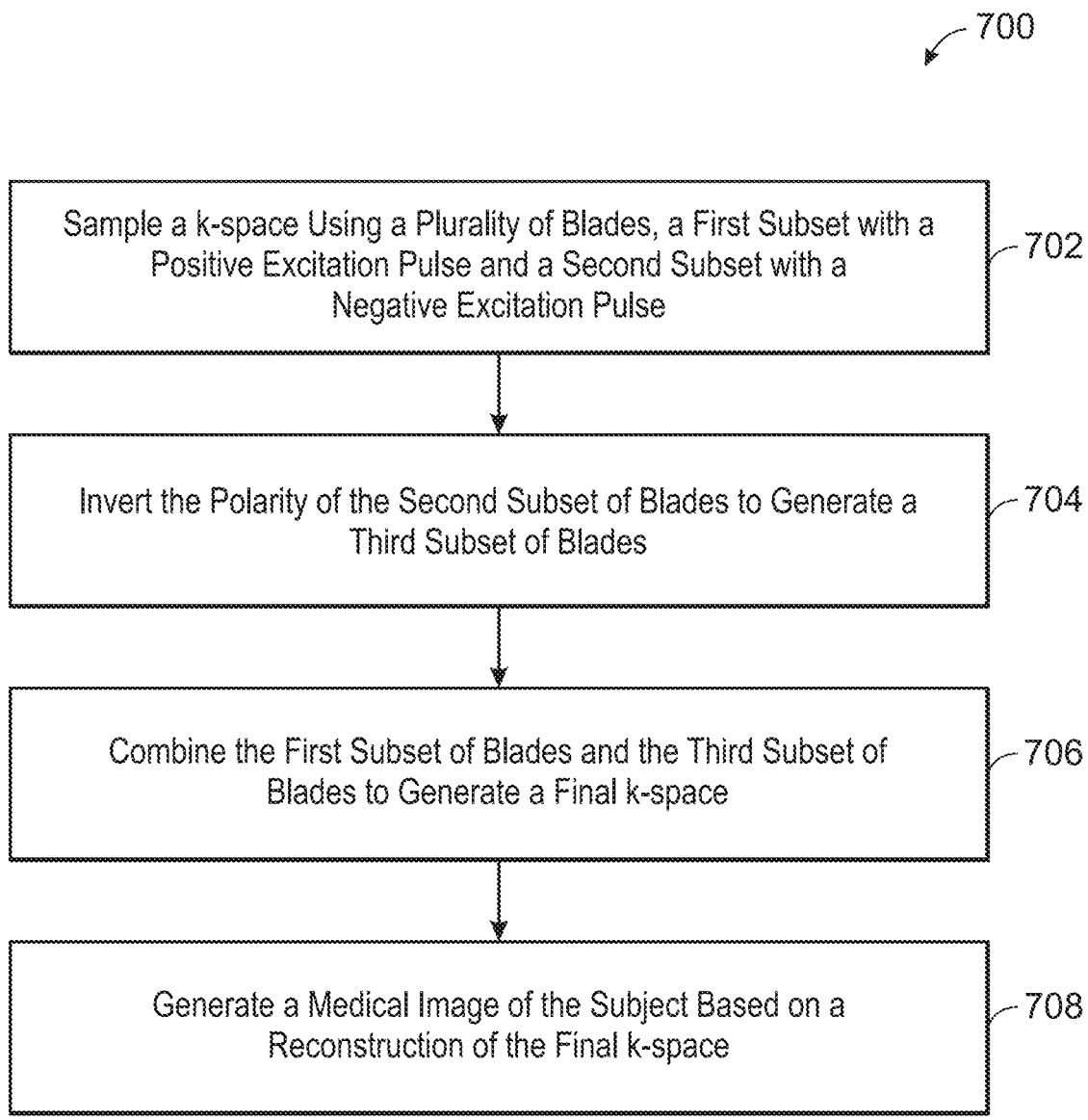
FIG. 7 is a flow chart representing a method for generating the MR image of a subject in accordance with an embodiment of the present technique.

FIG. 7 shows a flow chart 700 representing a method for imaging a subject, in accordance with an exemplary embodiment. The method can be performed by an MRI system, e.g., the MRI system 100 shown in FIG. 1. In some embodiments, at least some operations of the method can be performed at a device separate from the MRI system, or at cloud, or by any combination thereof. At step 702, a k-space is sampled in a rotating fashion using a plurality of radially directed blades around the center of the k-space. Among the plurality of blades, a first subset of blades is acquired with a positive excitation pulse and a first plurality of refocusing pulses (e.g., RF pulse sequence 404). Further, among the plurality of blades, a second subset of blades is acquired with a negative excitation pulse and a second plurality of refocusing pulses (e.g., RF pulse sequence 406).

It should also be noted that although the signs of excitation pulses are different for the first and second subset of blades, the signs of first and second plurality of refocusing pulses remains same e.g., positive in one embodiment. Because of the change of polarity of excitation pulses from blade to blade the unwanted signal changes the polarity, which results in the unwanted signal being spread out all over the image. This results in reduction of appearance of fine-line artifact in the final image.

In one embodiment, the first subset of blades includes odd blades, and the second subset of blades includes even blades. Alternatively, in another embodiment, the first subset of blades includes even blades, and the second subset of blades includes odd blades. In general, the plurality of radially directed blades is acquired sequentially, one after another. In other words, first one odd may be acquired then one even blade and the sequence continues till all the blades are acquired. For example, the blades may be acquired in a numerical order 1, 2, 3, 4 etc.

In one embodiment, the plurality of radially directed blades form a plurality of slices arranged in perpendicular fashion to each other. In another embodiment, each of the plurality of radially directed blades includes only a single radial k-space line. This results in each of the slice having a star shape and when they are stacked together, the overall structure looks like stack-of-stars sampling.

At step 704, the method may include inverting the polarity of the second subset of blades to generate a third subset of blades. Since the second subset of blades is obtained with a negative excitation pulse, it is pertinent to invert its polarity while reconstructing the final image. In one embodiment, inverting the polarity of the second subset of blades includes multiplying the second subset of blades with −1. In other words, the third subset of blades is obtained by reversing the polarity of second subset of blades.

At step 706, the first subset of blades and the third subset of blades is combined to generate a final k-space. The final k-space may be a two-dimensional (2D) k-space or a three-dimensional (3D) k-space. Combining the first subset of blades and third subset of blades may include placing the first and third subset of blades into the same K-Space. This is done to create a continuous and consistent dataset for the entire image. The goal is to ensure that there are no artifacts or seams in the final reconstructed image where the subsets of k-space data meet. In one embodiment, the combining process may be done during the reconstruction step. Specifically, at step 708, the medical image of the subject is generated based on reconstruction of the final k-space. In one embodiment, the reconstruction may be done by applying gridding reconstruction or non-uniform Fourier transform to the final k-space.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for imaging a subject using an magnetic resonance imaging (MRI) system comprising:
sampling a k-space in a rotating fashion using a plurality of radially directed blades around a center of the k-space, wherein a first subset of blades is acquired with a positive excitation pulse and a first plurality of refocusing pulses, and wherein a second subset of blades is acquired with a negative excitation pulse and a second plurality of refocusing pulses;
inverting a polarity of the second subset of blades to generate a third subset of blades;
combining the first subset of blades and the third subset of blades to generate a final k-space;
generating a medical image of the subject based on a reconstruction of the final k-space.

2. The method of claim 1, wherein the plurality of radially directed blades is acquired sequentially, one after another.

3. The method of claim 1, wherein the first subset of blades includes odd blades, and the second subset of blades includes even blades.

4. The method of claim 1, wherein the first subset of blades includes even blades, and the second subset of blades includes odd blades.

5. The method of claim 1, wherein inverting the polarity of the second subset of blades includes multiplying the second subset of blades with −1.

6. The method of claim 1, wherein the first plurality of refocusing pulses and the second plurality of refocusing pulses have same polarity.

7. The method of claim 1, wherein the first plurality of refocusing pulses and the second plurality of refocusing pulses both have a positive polarity.

8. The method of claim 1, wherein the plurality of radially directed blades form a plurality of slices arranged in perpendicular fashion to each other.

9. The method of claim 8, wherein each of the plurality of radially directed blades includes only a single radial k-space line.

10. The method of claim 1, wherein the final k-space is a two-dimensional (2D) k-space or a three-dimensional (3D) k-space.

11. A magnetic resonance imaging (MRI) system, comprising:
a magnet configured to generate a main magnetic field about at least a portion of a subject arranged in the MRI system;
a gradient coil assembly configured to apply at least one gradient field to the main magnetic field;
a radio frequency (RF) system configured to apply an RF field to the subject and to receive magnetic resonance signals from the subject;
a processing system programmed to:
sample a k-space in a rotating fashion using a plurality of radially directed blades around a center of the k-space, wherein a first subset of blades is acquired with a positive excitation pulse and a first plurality of refocusing pulses, and wherein a second subset of blades is acquired with a negative excitation pulse and a second plurality of refocusing pulses;
invert a polarity of the second subset of blades to generate a third subset of blades;
combine the first subset of blades and the third subset of blades to generate a final k-space;
generate a medical image of the subject based on a reconstruction of the final k-space.

12. The MRI system of claim 11, wherein the processing system is programmed to acquire the plurality of radially directed blades in a sequential manner, one after another.

13. The MRI system of claim 11, wherein the first subset of blades includes odd blades, and the second subset of blades includes even blades.

14. The MRI system of claim 11, wherein the first subset of blades includes even blades, and the second subset of blades includes odd blades.

15. The MRI system of claim 11, wherein the processing system is programmed to invert the polarity of the second subset of blades by multiplying the second subset of blades with −1.

16. The MRI system of claim 11, wherein the first plurality of refocusing pulses and the second plurality of refocusing pulses have same polarity.

17. The MRI system of claim 11, wherein the first plurality of refocusing pulses and the second plurality of refocusing pulses both have a positive polarity.

18. The MRI system of claim 11, wherein the plurality of radially directed blades form a plurality of slices arranged in perpendicular fashion to each other.

19. The MRI system of claim 18, wherein each of the plurality of radially directed blades includes only a single radial k-space line.

20. MRI system of claim 11, wherein the final k-space is a two-dimensional (2D) k-space or a three-dimensional (3D) k-space.

* * * * *